(12) United States Patent
Huang et al.

(10) Patent No.: US 10,347,596 B2
(45) Date of Patent: Jul. 9, 2019

(54) RADIO FREQUENCY POWER COMPONENT AND RADIO FREQUENCY SIGNAL TRANSCEIVING DEVICE

(71) Applicant: Huawei Technologies Co., Ltd., Shenzhen (CN)

(72) Inventors: An Huang, Shenzhen (CN); Yanhai Lin, Shenzhen (CN); Wei Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 252 days.

(21) Appl. No.: 15/467,484

(22) Filed: Mar. 23, 2017

(65) Prior Publication Data

US 2017/0194282 A1 Jul. 6, 2017

Related U.S. Application Data

(63) Continuation of application No. PCT/CN2014/087183, filed on Sep. 23, 2014.

(51) Int. Cl.
*H01L 23/66* (2006.01)
*H01L 23/00* (2006.01)
(Continued)

(52) U.S. Cl.
CPC ............ *H01L 23/66* (2013.01); *H01L 23/488* (2013.01); *H01L 24/49* (2013.01);
(Continued)

(58) Field of Classification Search
CPC . H01L 2224/49177; H01L 2224/49052; H01L 25/0655; H01L 23/66;
(Continued)

(56) References Cited

U.S. PATENT DOCUMENTS 6,812,580 B1 * 11/2004 Wenzel .................. H01L 23/50
257/691
7,456,505 B2 * 11/2008 Gospodinova .......... H01L 23/13
257/784
(Continued)

FOREIGN PATENT DOCUMENTS

CN 1414821 A 4/2003
CN 1417854 A 5/2003
(Continued)

*Primary Examiner* — Scott B Geyer
(74) *Attorney, Agent, or Firm* — Slater Matsil, LLP

(57) ABSTRACT

The application provides an apparatus, including a first section, a second section, and a first bonding wire group, where the first bonding wire group includes at least three first bonding wire units. The first bonding wire unit includes at least one arc-shaped bonding wire, one end and the other end of the first bonding wire unit are electrically connected to electrodes of the first section and the second section, respectively, where arc heights of first bonding wire units located at two sides of the first bonding wire group are higher than an arc height of a first bonding wire unit at another position, and an arc height of a first bonding wire unit located in a central area of the first bonding wire group is lower than an arc height of a first bonding wire unit at another position.

19 Claims, 3 Drawing Sheets

(51) Int. Cl.
*H01L 23/488* (2006.01)
*H01L 25/065* (2006.01)

(52) U.S. Cl.
CPC .......... *H01L 25/0655* (2013.01); *H01L 24/45* (2013.01); *H01L 24/48* (2013.01); *H01L 2223/6611* (2013.01); *H01L 2224/45124* (2013.01); *H01L 2224/45144* (2013.01); *H01L 2224/48011* (2013.01); *H01L 2224/48091* (2013.01); *H01L 2224/48137* (2013.01); *H01L 2224/48195* (2013.01); *H01L 2224/4909* (2013.01); *H01L 2224/4912* (2013.01); *H01L 2224/49052* (2013.01); *H01L 2224/49175* (2013.01); *H01L 2225/06506* (2013.01); *H01L 2924/00014* (2013.01)

(58) Field of Classification Search
CPC ... H01L 2223/6611; H01L 2924/30111; H01L 2924/19105; H01L 2224/4909; H01L 2224/49095; H01L 2224/49096; H01L 2224/49175; H01L 2224/49176; H01L 2224/4809; H01L 2224/48091; H01L 2224/48137; H01L 2224/48151; H01L 24/42; H01L 24/47; H01L 24/48; H01L 24/49
See application file for complete search history.

(56) References Cited

U.S. PATENT DOCUMENTS

| | | | | |
|---|---|---|---|---|
| 8,680,690 | B1* | 3/2014 | Steeneken | H04L 25/0272 257/664 |
| 2006/0192300 | A1* | 8/2006 | Appel | H01L 23/66 257/784 |
| 2007/0096340 | A1* | 5/2007 | Piel | H01L 24/49 257/781 |
| 2010/0094609 | A1 | 4/2010 | Han et al. | |
| 2010/0140721 | A1 | 6/2010 | Tagaki | |
| 2011/0037178 | A1* | 2/2011 | Sun | H01L 23/66 257/773 |
| 2011/0049505 | A1* | 3/2011 | Grabowski | H01L 23/645 257/41 |
| 2012/0222892 | A1 | 9/2012 | Sun et al. | |
| 2013/0051070 | A1 | 2/2013 | Wu | |
| 2013/0299958 | A1* | 11/2013 | Crisp | H01L 23/13 257/676 |
| 2014/0070365 | A1* | 3/2014 | Viswanathan | H01L 23/49589 257/531 |
| 2015/0221592 | A1* | 8/2015 | Verma | H01L 24/49 257/773 |

FOREIGN PATENT DOCUMENTS

| | | |
|---|---|---|
| CN | 102506347 A | 6/2012 |
| CN | 202977406 U | 6/2013 |
| DE | 10204157 A1 | 8/2003 |
| JP | S61220357 A | 9/1986 |
| JP | S62206844 A | 9/1987 |
| JP | H0697203 B2 | 11/1994 |
| JP | H09232383 A | 9/1997 |
| JP | H11238851 A | 8/1999 |
| JP | 2001148616 A | 5/2001 |
| JP | 2003110382 A | 4/2003 |
| JP | 2005064248 A | 3/2005 |
| JP | 2005251957 A | 9/2005 |
| JP | 2007141969 A | 6/2007 |
| JP | 2010161348 A | 7/2010 |
| JP | 2010258150 A | 11/2010 |
| WO | 2013136638 A1 | 9/2013 |

* cited by examiner

RADIO FREQUENCY POWER COMPONENT AND RADIO FREQUENCY SIGNAL TRANSCEIVING DEVICE

CROSS-REFERENCE TO RELATED APPLICATIONS

This application is a continuation of International Application No. PCT/CN2014/087183, filed on Sep. 23, 2014, the disclosure of which is hereby incorporated by reference in its entirety.

TECHNICAL FIELD

The present disclosure relates to the field of communications technologies, and in particular, to a radio frequency power component and a radio frequency signal transceiving device.

BACKGROUND

In a mobile communications network, after power amplification is performed on a radio frequency carrier signal by using a radio frequency power transistor, the radio frequency carrier signal is transmitted from an antenna to space. The radio frequency power transistor mainly includes sections such as an amplifier chip, a capacitor chip, a bonding wire, and a package. The bonding wire is configured to electrically connect electrodes of any two sections, implementing functions of impedance matching, and transmitting a direct current signal and a radio frequency signal.

Because a phase and an amplitude of a radio frequency signal have spatial distribution features, and currents and voltages on bonding wires in an existing bonding wire group are different, which causes that a radio frequency power transistor has an energy loss, and a bonding wire that loads an excessively large current is in the risk of burnout, resulting in a security risk to the radio frequency power transistor.

SUMMARY

Embodiments of the present disclosure provide a radio frequency power component, which can significantly reduce an energy loss of the radio frequency power component.

The embodiments of the present disclosure further provide a radio frequency signal transceiving device.

A first aspect provides a radio frequency power component, including a first section, a second section, and a first bonding wire group, where the first section and the second section are separately welded to a same side of a substrate body. The first bonding wire group includes at least three first bonding wire units, where there is a spacing between every two of the first bonding wire units, the first bonding wire unit includes at least one arc-shaped bonding wire, a vertex of an arc height of the bonding wire is away from the substrate body, one end of each first bonding wire unit is electrically connected to an electrode of the first section, and the other end of each first bonding wire unit is electrically connected to an electrode of the second section, so as to perform radio frequency signal transmission between the first section and the second section. Arc heights of first bonding wire units located at two sides of the first bonding wire group are higher than an arc height of a first bonding wire unit at another position in the first bonding wire group, and an arc height of a first bonding wire unit located in a central area of the first bonding wire group is lower than an arc height of a first bonding wire unit at another position in the first bonding wire group, so that currents passing through the at least three first bonding wire units are the same, or a phase difference between currents passing through any two first bonding wire units is less than a preset threshold.

In a first possible implementation manner of the first aspect, when the first bonding wire group includes more than three first bonding wire units, arc heights of first bonding wire units located between each of the two sides and the central area of the first bonding wire group are gradually reduced in a direction from each of the two sides of the first bonding wire group to the central area.

In a second possible implementation manner of the first aspect, or with reference to the first possible implementation manner of the first aspect, in a second possible implementation manner of the first aspect, the central area of the first bonding wire group includes one first bonding wire unit.

In a third possible implementation manner of the first aspect, or with reference to the first possible implementation manner of the first aspect, in a third possible implementation manner of the first aspect, the central area of the first bonding wire group includes at least two first bonding wire units with a same arc height.

In a fourth possible implementation manner of the first aspect, distances between every two adjacent first bonding wire units are equal.

In a fifth possible implementation manner of the first aspect, or with reference to any one of the first to the fourth possible implementation manners of the first aspect, in a fifth possible implementation manner of the first aspect, the first bonding wire unit includes multiple bonding wires, where arc heights of the multiple bonding wires are the same, and a vertex of an arc height of the first bonding wire unit is a vertex of an arc height of any of the bonding wires.

In a sixth possible implementation manner of the first aspect, or with reference to any one of the first to the fourth possible implementation manners of the first aspect, in a sixth possible implementation manner of the first aspect, the first bonding wire group is of an axially symmetric structure that uses a middle position in the first bonding wire group as an axis of symmetry.

In a seventh possible implementation manner of the first aspect, or with reference to any one of the first to the sixth possible implementation manners of the first aspect, in a seventh possible implementation manner of the first aspect, the radio frequency power component further includes a second bonding wire group, where the second bonding wire group is located at one side of the first bonding wire group, and the second bonding wire group includes at least three second bonding wire units, where there is a spacing between every two of the second bonding wire units, the second bonding wire unit includes at least one arc-shaped bonding wire, a vertex of an arc height of the bonding wire is away from the substrate body, one end of each second bonding wire unit is electrically connected to the electrode of the first section, and the other end of each second bonding wire unit is electrically connected to the electrode of the second section, so as to perform, together with the first bonding wire unit, the radio frequency signal transmission between the first section and the second section, where arc heights of second bonding wire units located at two sides of the second bonding wire group are higher than an arc height of a second bonding wire unit at another position in the second bonding wire group, and an arc height of a second bonding wire unit in a central area of the second bonding wire group is lower than an arc height of a second bonding wire unit at another position in the second bonding wire group, so that currents passing through the at least three second bonding wire units are the same, or a phase difference between currents passing through any two second bonding wire units is less than a preset threshold.

With reference to the seventh possible implementation manner of the first aspect, in an eighth possible implementation manner, when the second bonding wire group includes more than three second bonding wire units, arc heights of second bonding wire units located between each of the two sides and the central area of the second bonding wire group are gradually reduced in a direction from each of the two sides of the second bonding wire group to the central area.

With reference to the seventh possible implementation manner of the first aspect, in a ninth possible implementation manner, a distance between the first bonding wire group and the second bonding wire group is greater than the distance between two adjacent first bonding wire units and a distance between adjacent second bonding wire units.

With reference to any one of the seventh to the ninth possible implementation manners of the first aspect, in a tenth possible implementation manner, the central area of the second bonding wire group includes one second bonding wire unit.

With reference to any one of the seventh to the ninth possible implementation manners of the first aspect, in an eleventh possible implementation manner, the central area of the second bonding wire group includes at least two second bonding wire units with a same arc height.

With reference to any one of the seventh to the twelfth possible implementation manners of the first aspect, in a thirteenth possible implementation manner, the second bonding wire unit includes multiple bonding wires, where arc heights of the multiple bonding wires are the same, and a vertex of an arc height of the second bonding wire unit is a vertex of an arc height of any of the bonding wires.

With reference to any one of the seventh to the thirteenth possible implementation manners of the first aspect, in a fourteenth possible implementation manner, the second bonding wire group is of an axially symmetric structure that uses a middle position in the second bonding wire group as an axis of symmetry.

Or with reference to any one of the first to the fourteenth possible implementation manners of the first aspect, in a fifteenth possible implementation manner of the first aspect, the first section and the second section are both amplifier chips, or the first section is an amplifier chip and the second section is a capacitor chip, or the first section and the second section are both capacitor chips.

A second aspect provides a radio frequency signal transceiving device, including the radio frequency power component according to any possible implementation manner of the foregoing possible implementation manners, and an antenna, where the radio frequency power component is configured to process a radio frequency signal, and the antenna is configured to receive the radio frequency signal processed by the radio frequency power component and transmit the radio frequency signal.

In the embodiments of the present disclosure, the radio frequency power component includes a first section, a second section, and a first bonding wire group, where the first section and the second section are separately welded to a same side of a substrate body, and the first bonding wire group includes at least three first bonding wire units, where there is a spacing between every two of the first bonding wire units, the first bonding wire unit includes at least one arc-shaped bonding wire, a vertex of an arc height of the bonding wire is away from the substrate body, one end of each first bonding wire units is electrically connected to an electrode of the first section, and the other end of each first bonding wire unit is electrically connected to an electrode of the second section, so as to perform radio frequency signal transmission between the first section and the second section, where arc heights of first bonding wire units located at two sides of the first bonding wire group are higher than an arc height of a first bonding wire unit at another position in the first bonding wire group, and an arc height of a first bonding wire unit located in a central area of the first bonding wire group is lower than an arc height of a first bonding wire unit at another position in the first bonding wire group, so that currents passing through the at least three first bonding wire units are the same, or a phase difference between currents passing through any two first bonding wire units is less than a preset threshold. Therefore, in the present disclosure, currents in the at least three first bonding wire units are made identical as much as possible, that is, a phase difference is eliminated as far as possible, so as to optimize a total synthesized power of the radio frequency power component, and significantly reduce an energy loss of the radio frequency power component. In addition, current intensity is inversely proportional to an arc height of a bonding wire, and therefore, by increasing arc heights of bonding wire units at two sides, a risk of burning out the bonding wire units at two sides due to excessively large currents in the bonding wire units at two sides can be avoided, thereby further avoiding damage to a device, and reducing a usage cost.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Technologies described herein are applicable to various communications systems, including a second generation (2G) communications system, a third generation (3G) communications system, and a next generation communications system, for example, a 2G communications system such as a Global System for Mobile Communications (GSM); a 3G communications system such as a Wideband Code Division Multiple Access (WCDMA) system or a Time Division-Synchronous Code Division Multiple Access (TD-SCDMA) system; and a next generation communications system, such as a Long Term Evolution (LTE) communications system or an LTE-Advanced system.

A radio frequency power component provided in the embodiments of the present disclosure may be integrated into any network element device, such as a base station, that needs to perform wireless signal power amplification. Specifically, the radio frequency power component provided in the embodiments of the present disclosure may work in a radio frequency part of the base station, for example, the radio frequency power component may be disposed in a radio remote unit (RRU) of the base station. The base station may be a base transceiver station (BTS) in a GSM system or a code division multiple access (CDMA) system, or a node B in a WCDMA system, or an evolved node B (e-NodeB) in an LTE system, or a similar device in an evolved communications system after the LTE.

In a bonding wire group provided in the prior art, arc heights of all bonding wires are the same. It is found by means of experiments and simulation that the prior art has the following problem: during transmission of a radio frequency signal in a bonding wire group, current intensity of the signal is unbalanced, that is, currents in bonding wire units located at two sides of the bonding wire group are the largest, a current in a bonding wire unit located at a middle position in the bonding wire group is the smallest, and currents in other bonding wire units are gradually reduced from the two sides to the middle. Therefore, a radio frequency power component cannot achieve an optimal total synthesized power, and has a great energy loss; in addition, currents in the bonding wires at the two sides are obviously greater than a current in a middle area, and therefore, the bonding wires located at the two sides are in the risk of burnout.

Figure 1:
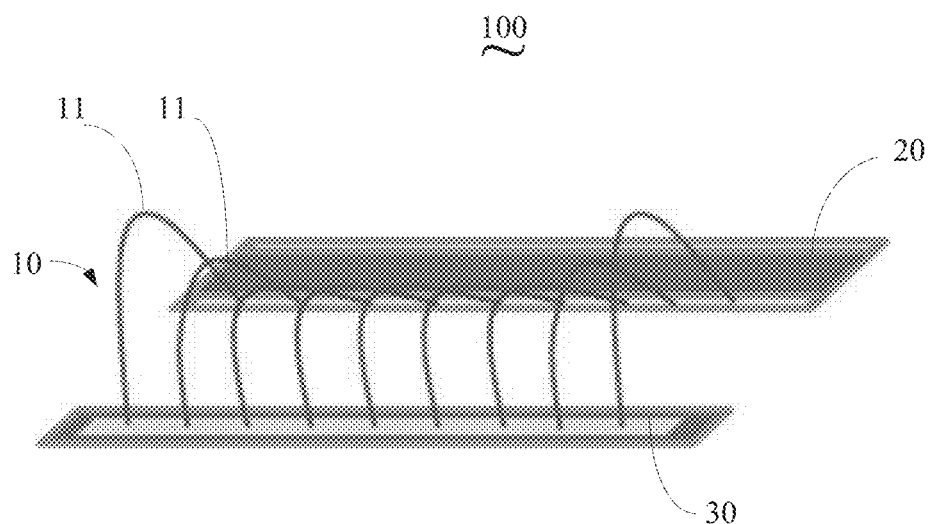
FIG. 1 is a schematic diagram of a radio frequency power component according to a first implementation manner of a first aspect of the present disclosure.
Figure 2:
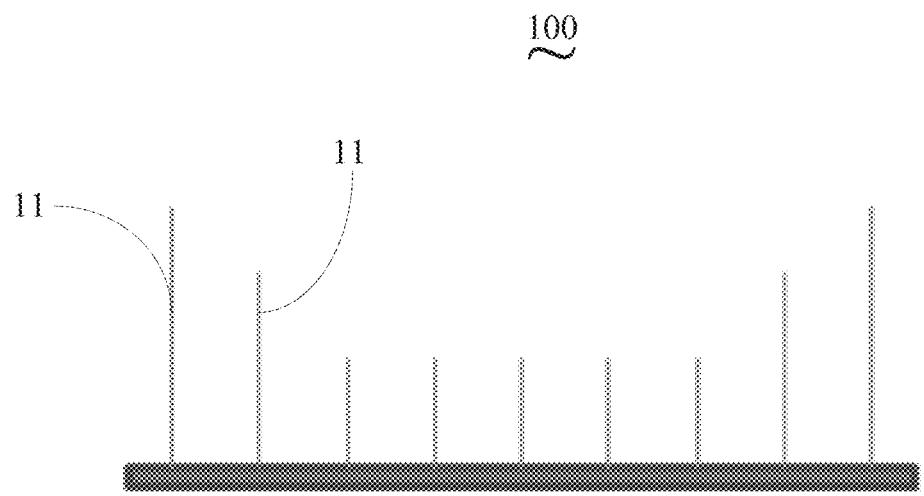
FIG. 2 is a front view of a radio frequency power component according to a first implementation manner of a first aspect of the present disclosure in FIG. 1.

Refer to FIG. 1 and FIG. 2, which show a radio frequency power component 100 according to a first implementation manner of a first aspect of the present disclosure. The radio frequency power component 100 includes a first bonding wire group 10, a first section 20, and a second section 30. The first section 20 and the second section 30 are separately welded to a same side of a substrate body. The first bonding wire group 10 includes at least three first bonding wire units 11. There is a spacing between every two first bonding wire units 11. The first bonding wire unit 11 includes at least one arc-shaped bonding wire. A vertex of an arc height of the bonding wire is away from the substrate body. One end of each first bonding wire unit 11 is electrically connected to an electrode of the first section 20, and the other end of each first bonding wire unit 11 is electrically connected to an electrode of the second section 30, so as to perform radio frequency signal transmission between the first section 20 and the second section 30.

Arc heights of first bonding wire units 11 located at two sides in the first bonding wire group 10 are higher than an arc height of a first bonding wire unit 11 at another position in the first bonding wire group 10, and an arc height of a first bonding wire unit 11 located in a central area of the first bonding wire group 10 is lower than an arc height of a first bonding wire unit 11 at another position in the first bonding wire group 10, so that currents passing through the at least three first bonding wire units 11 are the same, or a phase difference between currents passing through any two first bonding wire units 11 is less than a preset threshold.

The central area may be an area formed between x microns to the left and y microns to the right of a middle position in the first bonding wire group 10. A specific range of the central area may be determined by means of experiments and tests according to requirements on a size and performance of the radio frequency power component, and is not specifically limited in this embodiment of the present disclosure. For example, the radio frequency power component includes only one bonding wire group, and a total length of the bonding wire group is 6 mm, where a spacing between every two bonding wire units is 120 um; in this case, the middle area may be an area whose left side is 240 um away from the middle position and right side is 240 um away from the middle position, and a bonding wire unit in this area is used as a bonding wire unit of the central area. It may be understood that in this embodiment, if the central area includes multiple bonding wire units, heights of the multiple bonding wire units may be set equal. For example, as shown in FIG. 2, the central area in the first bonding wire group 10 includes 5 first bonding wire units 11 with a same height.

The preset threshold may be determined on a basis that the radio frequency power component can achieve an optimal a total synthesized power without being affected, that is, the preset threshold is determined according to a performance requirement of the radio frequency power component, and sizes of used radio frequency power transistors, quantities of bonding wire units, and current intensity passing through the bonding wire units vary in different scenarios, and therefore, the preset threshold is not specially limited in this embodiment of the present disclosure, and a person skilled in the art may determine the preset threshold by means of experiments or according to experience. In an actual application, arc heights of bonding wire units are adjusted multiple times, so that currents passing through the bonding wire units can be identical.

Optionally, in another embodiment of the present disclosure, the central area may include only one bonding wire unit, and an arc height of the bonding wire is the lowest in the entire bonding wire group.

Optionally, the first section 20 may be an amplifier chip, and the second section 30 may be a capacitor chip. Optionally, the first section 20 and the second section 30 may both be amplifier chips. The first section 20 may be an amplifier chip and the second section 30 may be a capacitor chip, or the first section 20 and the second section 30 are capacitor chips. Specific forms of the first section 20 and the second section 30 are not limited in this embodiment of the present disclosure.

Optionally, as shown in FIG. 2, when the first bonding wire group 10 includes more than three first bonding wire units 11, arc heights of first bonding wire units 11 located between each of the two sides and the central area of the first bonding wire group 10 are gradually reduced in a direction from each of the two sides of the first bonding wire group 10 to the central area.

Optionally, each first bonding wire unit 11 may include one bonding wire. The bonding wire is a metal wire, such as an aluminum wire or a gold wire.

Optionally, the radio frequency power component 100 may be a radio frequency power transistor, or the radio frequency power component 100 may be a radio frequency connector, power splitter, combiner, or the like, which is not limited in this embodiment of the present disclosure.

It should be noted that the first bonding wire unit 11 includes at least one arc-shaped bonding wire. A vertex of an arc height of the bonding wire is away from the substrate body. That one end of each first bonding wire unit 11 is electrically connected to the electrode of the first section 20, and the other end of each first bonding wire unit 11 is electrically connected to the electrode of the second section 30 indicates that a distance from the first section 20 to the second section 30 is less than a length of the first bonding wire unit 11. In the first bonding wire unit 11, the vertex of the arc height is a point having a largest distance from the substrate body. The distance from the vertex of the arc height to the substrate body is the arc height of the corresponding first bonding wire unit 11.

It is determined by means of experiments and software simulation that there is mutual inductance between any two bonding wire units, and inductance of a bonding wire unit increases as an arc height of the bonding wire unit increases. Because inductance is inversely proportional to the magnitude of a current, the current is reduced as the inductance increases. That is, the arc height is inversely proportional to the magnitude of a current. Therefore, in this implementation manner, arc heights of first bonding wire units 11 located at two sides of the first bonding wire group 10 are higher than an arc height of a first bonding wire unit 11 at another position in the first bonding wire group 10, and an arc height of a first bonding wire unit 11 located in a central area of the first bonding wire group 10 is lower than an arc height of a first bonding wire unit 11 at another position in the first bonding wire group 10, so that currents passing through the at least three first bonding wire units 11 are the same, or a phase difference between currents passing through any two first bonding wire units 11 is less than a preset threshold, thereby solving the problem of unbalanced transmission of a radio frequency signal in the bonding wire group, and making the currents in the at least three first bonding wire units 11 identical as much as possible. Therefore, in the present disclosure, the currents in the at least three first bonding wire units 11 are made identical as much as possible, that is, a phase difference is eliminated as far as possible, so that the radio frequency power component 100 achieves an optimal total synthesized power, thereby significantly reducing an energy loss of the radio frequency power component 100. In addition, current intensity is inversely proportional to an arc height of a bonding wire, and therefore, by increasing the arc heights of the bonding wire units 11 at the two sides, a risk of burning out the bonding wire units 11 at the two sides due to excessively large currents in the bonding wire units 11 at the two sides can be avoided, thereby further avoiding damage to a section, and reducing a usage cost.

For example, two radio frequency signals A and B are combined, a phase difference between the two signals is Y, and a synthesized radio frequency signal is C; in this case, the synthesized radio frequency signal C, the radio frequency signals A and B, and the phase difference Y satisfy the following theorem relationship: $C*C=A*A+B*B-2*A*B*\cos(Y)$, where A, B, and C all may indicate an amplitude value. It may be known that, when there is no phase difference between currents in the first bonding wire unit 11, Y=0, an amplitude value of the synthesized radio frequency signal is maximum, and the total synthesized power is maximum.

Certainly, because a current of a first bonding wire unit 11 close to the middle position is almost the same as a current of a first bonding wire unit 11 located in the middle position, the central area of the first bonding wire group may include at least two first bonding wire units 11 with a same arc height.

Further, there is an equal spacing between every two adjacent first bonding wire units 11, so as to improve stability of the radio frequency power component 100. In addition, desirable impedance matching may be achieved between the amplifier chip 20 and the first bonding wire group 10.

It should be noted that the amplifier chip 20 may be abstractly divided into several amplifier units. Each amplifier unit corresponds to one first bonding wire unit 11 in the first bonding wire group 10, and because there is an equal spacing between every two adjacent first bonding wire units 11, it indicates that the amplifier chip 20 is equally divided. Therefore, a radio frequency signal in the first bonding wire unit 11 corresponding to each amplifier unit has a same voltage. In addition, because the arc heights of the first bonding wire units 11 are gradually reduced from the two sides to the central area, the radio frequency signal in each first bonding wire unit 11 has a same current. Because the radio frequency signal in each first bonding wire unit 11 has a same voltage and a same current, that is, the radio frequency signal in each first bonding wire unit 11 has a same power, there is no problem of horizontal transmission of the radio frequency signal, thereby improving the stability of the radio frequency power component 100. The horizontal transmission means that a radio frequency signal transmitted in one bonding wire unit 11 is transmitted in a direction towards another adjacent bonding wire unit.

Because the amplifier chip 20 is abstractly and equally divided into several amplifier units, an impedance of the amplifier chip 20 is also abstractly and equally divided. Assuming that the impedance of the amplifier chip 20 is Z, each amplifier unit has a fixed and equal impedance $Z_o=Z/N$, where N is a quantity of the amplifier units, N is greater than or equal to 2, and N is an integer. An impedance of the first bonding wire group is $Z_i=V_i/I_i$, where $V_i$ is a voltage amplitude value of an amplifier unit corresponding to the $i^{th}$ first bonding wire unit 11, and $I_i$ is a current value of the amplifier unit corresponding to the $i^{th}$ first bonding wire unit 11. Each amplifier unit has a same voltage amplitude value, and each amplifier unit has a same current amplitude value; therefore, the first bonding wire units 11 have a same impedance $Z_i$, that is, the first bonding wire units 11 may simultaneously achieve an impedance conjugate matching state with the impedances $Z_o$ of the corresponding amplifier units. Therefore, the radio frequency power component 100 may output an optimal power.

Further, the first bonding wire group 10 is of an axially symmetric structure that uses the middle position in the first bonding wire group as an axis of symmetry.

Optionally, in the first bonding wire unit 11, the highest arc height may be twice the lowest arc height. In another implementation manner, the arc height of each first bonding wire unit 11 may be adjusted according to an actual need, as long as it is ensured that the arc heights of the first bonding wire units 11 located at the two sides are higher than an arc height of another first bonding wire unit 11 in the first bonding wire group 10, the arc height of the first bonding wire unit 11 located in the middle position is lower than an arc height of another first bonding wire unit 11 in the first bonding wire group 10, and arc heights of other first bonding wire units 11 are gradually reduced from the two sides to the middle position.

When a quantity of first bonding wire units 11 included in the first bonding wire group 10 is an odd number, a first bonding wire unit 11 at the middle position in the first bonding wire group 10 is used as an axis of symmetry, so that the first bonding wire group 10 is of a symmetric structure relative to the axis of symmetry. When the quantity of first bonding wire units 11 included in the first bonding wire group 10 is an even number, a center line between two first bonding wire units 11 in the middle of the first bonding wire group 10 is used as an axis of symmetry, so that the first bonding wire group 10 is of an axially symmetric structure relative to the center line. That is, the bonding wire group is of a symmetric structure, first bonding wire units 11 at corresponding positions on the left and right have an equal height, and arc heights of the first bonding wire units 11 from the two sides to the central area are gradually reduced, where the corresponding positions refer to physical positions, in the first bonding wire group 10, whose distances to the foregoing axis of symmetry are equal.

It should be noted that when the central area includes at least two first bonding wire units 11 having an equal height, the arc height of any of the at least two first bonding wire units 11 may be used as an arc height of the central area.

It should be noted that the arc heights of the first bonding wire units 11 may be adjusted according to detected currents in the first bonding wire units 11, so that when the first bonding wire units 11 have a same current, the adjustment of the arc heights of the first bonding wire units 11 is stopped. At this time, a cross section of the first bonding wire group 10 is shown in FIG. 2.

Figure 3:
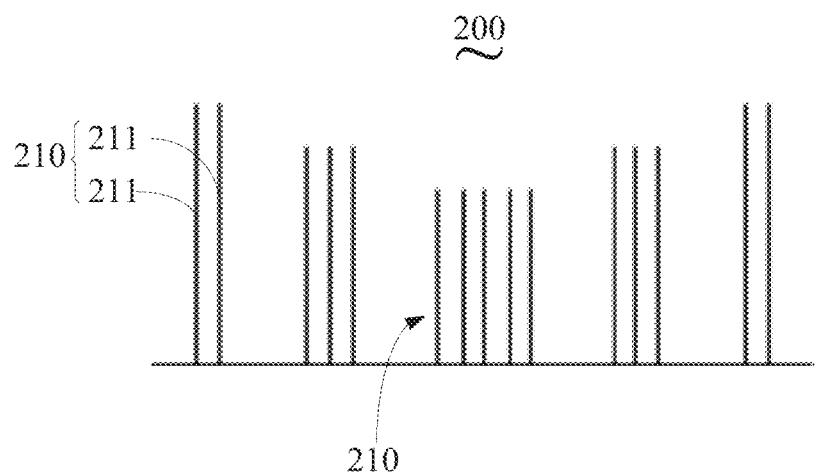
FIG. 3 is a front view of a radio frequency power component according to a second implementation manner of the first aspect of the present disclosure.

Referring to FIG. 3, a second implementation manner of the first aspect of the present disclosure provides a radio frequency power component 200. The radio frequency power component 200 provided in the second implementation manner of the present disclosure is similar to the radio frequency power component 100 provided in the first implementation manner, and a difference between the two lies in that: in the second implementation manner, each first bonding wire unit 210 includes multiple bonding wires 211, and arc heights of the multiple bonding wires 211 may be the same.

In this implementation manner, each first bonding wire unit 210 is a bundle of bonding wires. Each bundle of bonding wires may include a different quantity of bonding wires 211, as shown in FIG. 3. In another embodiment, each bundle of bonding wires may include a same quantity of bonding wires 211. Distances between every two adjacent bonding wires 211 in each bundle of bonding wires are the same.

That the distances between every two adjacent bonding wires 211 in each bundle of bonding wires are the same and that distances between every two adjacent first bonding wire units 11 are the same in the embodiment of FIG. 1 or FIG. 2 may achieve a same effect, and details are not described herein again.

In this implementation manner, arc heights of the bonding wires 211 in each first bonding wire unit 210 are the same. In this case, an arc height of the first bonding wire unit 210 is the arc height of any bonding wire 211 in the unit. In another implementation manner, arc heights of the bonding wires 211 in each first bonding wire unit 210 may be different, as long as it is ensured that bonding wires 211 that are close to an outer side of the first bonding wire unit 210 are gradually higher than bonding wires 211 that are close to an inner side of the first bonding wire unit 210. In this case, the arc height of the first bonding wire unit 210 is an arc height of a bonding wire 211 having a minimum arc height. Therefore, an arc height relationship among bonding wires 211 in each first bonding wire unit 210 is not specifically limited in the present disclosure.

Figure 4:
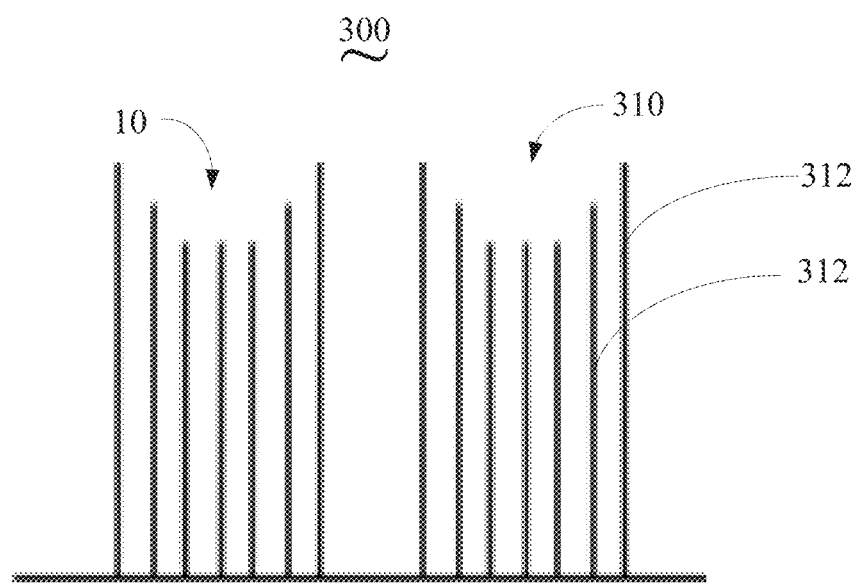
FIG. 4 is a front view of a radio frequency power component according to a third implementation manner of the first aspect of the present disclosure.

Referring to FIG. 4, a third implementation manner of the first aspect of the present disclosure shows a radio frequency power component 300. The radio frequency power component 300 provided in the third implementation manner of the present disclosure is similar to the radio frequency power component 100 provided in the first implementation manner, and a difference between the two lies in that: in the third implementation manner, the radio frequency power component 300 includes a first bonding wire group 10 and a second bonding wire group 310, and the first bonding wire group 10 may be the first bonding wire group 10 in the embodiment shown in FIG. 1 or FIG. 2, which is not described herein again.

The second bonding wire group 310 includes at least three second bonding wire units 312. There is a spacing between every two second bonding wire units 312. The second bonding wire unit 312 includes at least one arc-shaped bonding wire. A vertex of an arc height of the bonding wire is away from the substrate body. One end of each second bonding wire unit 312 is electrically connected to the electrode of the first section 20. The other end of each second bonding wire unit 312 is electrically connected to the electrode of the second section 30, and the second bonding wire unit 312 is arranged side by side with the first bonding wire unit 11, so as to perform, together with the first bonding wire unit 11, the radio frequency signal transmission between the first section and the second section.

Arc heights of second bonding wire units 312 located at two sides of the second bonding wire group 310 are higher than an arc height of a second bonding wire unit 312 at another position in the second bonding wire group 310, and an arc height of a second bonding wire unit 312 in a central area of the second bonding wire group 310 is lower than an arc height of a second bonding wire unit 312 at another position in the second bonding wire group 310, so that currents passing through the at least three second bonding wire units 312 are the same, or a phase difference between currents passing through any two second bonding wire units 312 is less than a preset threshold. The central area may be an area formed between x microns to the left and y microns to the right of a middle position in the second bonding wire group 310.

Further, when the second bonding wire group 310 includes more than three second bonding wire units 312, arc heights of second bonding wire units 312 located between each of the two sides and the central area of the second bonding wire group 310 are gradually reduced in a direction from each of the two sides of the second bonding wire group 310 to the central area.

A distance between the first bonding wire group 10 and the second bonding wire group 310 is greater than a distance between two adjacent first bonding wire units 11 in the first bonding wire group 10 and is greater than a distance between two adjacent second bonding wire units 312 in the second bonding wire group 310.

Maintaining a proper distance between two bonding wire groups may prevent the first bonding wire group 10 and the second bonding wire group 310 from affecting each other; otherwise, a current balance of the first bonding wire group 10 and a current balance of the second bonding wire group 310 are broken, which affects stability of the radio frequency power component 300.

It should be noted that in the first implementation manner, if a current between the first section 20 and the second section 30 is excessively large, the arc heights of the first bonding wire units 11 located at the two sides are required to be higher, so as to balance the excessively large current. Therefore, in the third implementation manner, the second bonding wire group 310 is added to shunt the current between the first section 20 and the second section 30, so as to prevent the stability of the radio frequency power component 300 from being affected because a first bonding wire unit 11 having an excessive arc height in the first bonding wire group 10 touches a housing of the radio frequency power component 300.

That the second bonding wire unit 312 includes at least one arc-shaped bonding wire, where one end of the second bonding wire unit 312 is electrically connected to the electrode of the first section 20, and the other end of the second bonding wire unit 312 is electrically connected to the electrode of the second section 30 indicates that a distance from the first section 20 to the second section 30 is less than a length of the second bonding wire unit 312. In the second bonding wire unit 312, the vertex of the arc height is a point having a largest distance from the substrate body. The distance from the vertex of the arc height to the substrate body is the arc height of the corresponding second bonding wire unit 312.

Certainly, because a current of a second bonding wire unit 312 close to the middle position in the second bonding wire group 310 is almost the same as a current of a second bonding wire unit 312 located at the middle position in the second bonding wire group 310, the central area of the second bonding wire group 310 may include at least two second bonding wire units 312 with a same arc height.

Further, there is an equal spacing between every two adjacent second bonding wire units 312, which improves the stability of the radio frequency power component 300. In addition, desirable impedance matching is achieved between the amplifier chip 20 and the second bonding wire group 310.

It should be noted that the amplifier chip 20 is abstractly divided into several amplifier units. Each second bonding wire unit 312 corresponds to one amplifier unit, and each first bonding wire unit 11 also corresponds to one amplifier unit. The foregoing specific arrangement of the first bonding wire group 10 may improve the stability of the radio frequency power component 300, which has been elaborated in detail, and therefore, is not described herein again. For the second bonding wire group 310, because there is an equal spacing between every two adjacent second bonding wire units 312, it indicates that the part, corresponding to the second bonding wire group 310, of the amplifier chip 20 is also equally divided. Therefore, a radio frequency signal in the second bonding wire unit 312 corresponding to each amplifier unit has a same voltage. In addition, because the arc heights of the second bonding wire units 312 are gradually reduced from the two sides to the central area, the radio frequency signal in each second bonding wire unit 312 has a same current. Because the radio frequency signal in each second bonding wire unit 312 has a same voltage and a same current, that is, the radio frequency signal in each second bonding wire unit 312 has a same power, there is no problem of horizontal transmission of the radio frequency signal, thereby improving the stability of the radio frequency power component 300.

Because the part, corresponding to the second bonding wire group 310, of the amplifier chip 20 is also abstractly and equally divided into several amplifier units, an impedance of the part, corresponding to the second bonding wire group 310, of the amplifier chip 20 is also abstractly and equally divided. Assuming that the impedance of the amplifier chip 20 is Z, and the first bonding wire group 10 and the second bonding wire group 310 are the same, the first bonding wire group 10 and the second bonding wire group 310 each correspond to one half of the impedance, that is, Z/2, of the amplifier chip 20. If the amplifier chip 20 is abstractly and equally divided into 2M (where M is greater than or equal to 1, and M is an integer) amplifier units, the first bonding wire group 10 and the second bonding wire group 310 each correspond to M amplifier units, and an impedance of an amplifier unit corresponding to each second bonding wire unit 312 in the second bonding wire group 310 is $Z_o = Z/(2*M)$. Similarly, an impedance of an amplifier unit corresponding to each first bonding wire unit 11 in the first bonding wire group 10 is $Z_o = Z/(2*M)$. An impedance of the second bonding wire group is $Z_i = V_i/I_i$, where $V_i$ is a voltage amplitude value of an amplifier unit corresponding to the $i^{th}$ second bonding wire unit 312, and $I_i$ is a current value of the amplifier unit corresponding to the $i^{th}$ second bonding wire unit 312. Each amplifier unit has a same voltage amplitude value, and each amplifier unit has a same current amplitude value; therefore, the second bonding wire units 312 have a same impedance $Z_i$, that is, several second bonding wire units 312 can simultaneously achieve an impedance conjugate matching state with the impedances $Z_o$ of the corresponding amplifier units. Therefore, the radio frequency power component 300 may output an optimal power.

It should be noted that, the foregoing assumes that the first bonding wire group 10, the second bonding wire group 310, and the amplifier chip 20 are equally divided, so that an amplifier unit corresponding to each first bonding wire unit 11 and an amplifier unit corresponding to each second bonding wire unit 312 have a same impedance is only for ease of description. Specifically, how to abstractly divide the amplifier chip 20 further needs to be determined according to an actual impedance proportion relationship between the first bonding wire group 10 and the second bonding wire group 310, that is, the amplifier chip 20 may be correspondingly divided according to the actual impedance proportion relationship.

Optionally, in this implementation manner, the bonding wire units 11 in the first bonding wire group 10 and the bonding wire units 312 in the second bonding wire group 310 may be one bonding wire, or may be multiple bonding wires. Alternatively, in the first bonding wire group 10 and the second bonding wire group 310, the bonding wire units in one bonding wire group is one bonding wire, and the bonding wire unit in the other bonding wire group is multiple bonding wires. For the case in which the bonding wire units are one bonding wire, reference may be made to the embodiment shown in FIG. 1 and FIG. 2, and for the case in which the bonding wire units are multiple bonding wires, reference may be made to the embodiment shown in FIG. 3.

Further, the second bonding wire group 310 is of an axially symmetric structure that uses the middle position in the second bonding wire group as an axis of symmetry.

Optionally, in the second bonding wire unit 312, the highest arc height may be twice the lowest arc height. In another implementation manner, the arc heights of the second bonding wire units 312 may be adjusted according to an actual need, as long as it is ensured that the arc heights of the second bonding wire units 312 located at the two sides are higher than an arc height of another second bonding wire unit 312 in the second bonding wire group 310, the arc height of the second bonding wire unit 312 located at the middle position is lower than an arc height of another second bonding wire unit 312 in the second bonding wire group 310, and arc heights of other second bonding wire units 312 are gradually reduced from the two sides to the middle position.

When a quantity of second bonding wire units 312 included in the second bonding wire group 310 is an odd number, a second bonding wire unit 312 in the middle position in the second bonding wire group 310 is used as an axis of symmetry, so that the second bonding wire group 310 is of a symmetric structure relative to the axis of symmetry. When the quantity of the second bonding wire units 312 included in the second bonding wire group 310 is an even number, a center line of two second bonding wire units 312 in the middle of the second bonding wire group 310 is used as an axis of symmetry, so that the second bonding wire group 312 is of a symmetric structure relative to the center line.

It should be noted that the arc heights of the second bonding wire units 312 may be adjusted according to a detected current in each second bonding wire unit 312, so that when the first bonding wire units 11 have a same current, the adjustment of the arc heights of the second bonding wire units 312 is stopped. At this time, a cross section of the second bonding wire group 310 is shown in FIG. 4. It may be understood that in this implementation manner, the first bonding wire group 10 and the second bonding wire group 310 are disposed independently, and a quantity of bonding wire units in each bonding wire group and heights of bonding wires may be independently adjusted. For example, the structure of the second bonding wire group 310 may be set to be completely the same as that of the first bonding wire group 10, so as to reduce processing complexity of a device. For more descriptions of the second bonding wire group 310, reference may be made to the description of the first bonding wire group 10, which is not described herein again.

It may be understood that in another embodiment of the present disclosure, more than two independent bonding wire group units may further be set; for a structure and an arrangement manner, refer to the bonding wire group design provided in the foregoing embodiment; and a specific quantity of bonding wire groups is determined according to a requirement on device performance, which is not specifically limited in this embodiment of the present disclosure.

In this implementation manner, in addition to the effects of the foregoing implementation manner, for the bonding wire in this implementation manner, the second bonding wire group 310 and the first bonding wire group 10 are arranged side by side, so as to distribute a current between the first section 20 and the second section 30, and further prevent the stability of the radio frequency power component 300 from being affected because a first bonding wire unit 11, whose arc height is required to be higher, in the first bonding wire group 10 touches a housing of the radio frequency power component 300.

Figure 5:
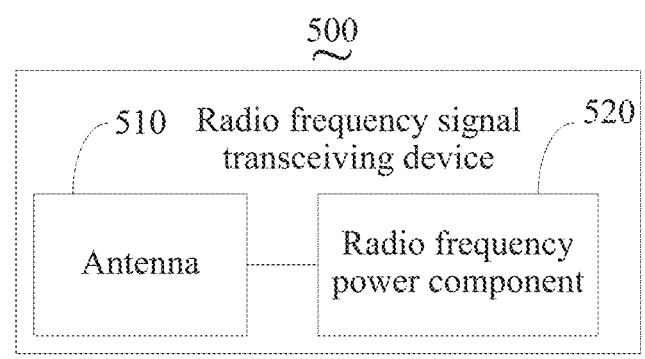
FIG. 5 shows a radio frequency signal transceiving device according to an implementation manner of a second aspect of the present disclosure.

Referring to FIG. 5, an optional implementation manner of a second aspect of the present disclosure provides a radio frequency signal transceiving device 500. The radio frequency signal transceiving device 500 includes an antenna 510 and a radio frequency power component 520. The antenna 510 may be directly or may be indirectly connected to the radio frequency power component 520. The radio frequency power component 520 is configured to process a radio frequency signal. The antenna 510 is configured to receive the radio frequency signal processed by the radio frequency power component 520 and transmit the radio frequency signal. The radio frequency power component 520 may be the radio frequency power component 100, 200, or 300 provided in any implementation manner of the first to the third implementation manners of the first aspect. A specific structure and arrangement manner of the radio frequency power component 100, 200, or 300 have been specifically elaborated in the first to the third implementation manners of the foregoing first aspect, and are not described herein again.

The radio frequency signal transceiving device 500 may be a transmitter, a base station, a radio remote unit, or the like.

In this implementation manner, in the first bonding wire group 10, arc heights of first bonding wire units 11 located at two sides of the first bonding wire group 10 are higher than an arc height of a first bonding wire unit 11 at another position in the first bonding wire group 10, and an arc height of a first bonding wire unit 11 located in a central area of the first bonding wire group 10 is lower than an arc height of a first bonding wire unit 11 at another position in the first bonding wire group 10, so that currents passing through the at least three first bonding wire units 11 are the same, or a phase difference between currents passing through any two first bonding wire units 11 is less than a preset threshold, thereby solving the problem of unbalanced transmission of a radio frequency signal in the bonding wire group, and making the currents in the at least three first bonding wire units 11 identical as much as possible.

Therefore, in the present disclosure, the currents on the at least three first bonding wire units 11 are made identical as much as possible, that is, a phase difference is eliminated as far as possible, so that the radio frequency power component 100 achieves an optimal total synthesized power, thereby significantly reducing an energy loss of the radio frequency power component 100, and further significantly reducing an energy loss of the radio frequency signal transceiving device 500. In addition, current intensity is inversely proportional to an arc height of a bonding wire, and therefore, by increasing arc heights of bonding wire units 11 at two sides, a risk of burning out the bonding wire units 11 at two sides due to excessively large currents on the bonding wire units 11 at two sides may be avoided, thereby further avoiding damage to a section, and reducing a usage cost.

Finally, it should be noted that the foregoing embodiments are merely intended for describing the technical solutions of the present disclosure, but not for limiting the present disclosure. Although the present disclosure is described in detail with reference to the foregoing embodiments, a person of ordinary skill in the art should understand that the descriptions are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:
1. An apparatus, comprising:
a first section;
a second section, wherein the first section and the second section are separately welded to a same side of a substrate body; and
a first bonding wire group;

wherein the first bonding wire group comprises at least three bonding wire units, and wherein there is a spacing between bonding wire units of the first bonding wire group;

wherein each bonding wire unit of the first bonding wire group comprises at least one arc-shaped bonding wire, wherein a vertex of an arc height of the at least one arc-shaped bonding wire is away from the substrate body, wherein one end of each bonding wire unit of the first bonding wire group is electrically connected to an electrode of the first section, and wherein another end of each bonding wire unit of the first bonding wire group is electrically connected to an electrode of the second section, to perform radio frequency signal transmission between the first section and the second section; and wherein arc heights of bonding wire units of the first bonding wire group located at two sides of the first bonding wire group are higher than an arc height of a first bonding wire unit at another position in the first bonding wire group, and wherein an arc height of a third bonding wire unit located in a central area of the first bonding wire group is lower than an arc height of a fourth bonding wire unit at another position in the first bonding wire group, so that currents passing through the bonding wire units of the first bonding wire group are the same.

2. The apparatus according to claim 1, wherein arc heights of bonding wire units of the first bonding wire group located between the two sides and the central area of the first bonding wire group are gradually reduced in a direction from the two sides of the first bonding wire group to the central area, wherein the first bonding wire group comprises more than three bonding wire units.

3. The apparatus according to claim 1, wherein the central area of the first bonding wire group comprises one bonding wire unit.

4. The apparatus according to claim 1, wherein the central area of the first bonding wire group comprises at least two bonding wire units with a same arc height.

5. The apparatus according to claim 1, wherein distances between adjacent bonding wire units of the first bonding wire group are equal.

6. The apparatus according to claim 1, wherein the first bonding wire unit comprises multiple bonding wires, wherein arc heights of the multiple bonding wires are the same, and wherein a vertex of an arc height of the first bonding wire unit is a vertex of an arc height of any of the bonding wires of the first bonding wire unit.

7. The apparatus according to claim 1, wherein the first bonding wire group is of an axially symmetric structure that uses a middle position in the first bonding wire group as an axis of symmetry.

8. The apparatus according to claim 1, further comprising a second bonding wire group, wherein the second bonding wire group is located at one side of the first bonding wire group, and wherein the second bonding wire group comprises at least three bonding wire units, wherein there is a spacing between bonding wire units of the second bonding wire group;

wherein each bonding wire unit of the second bonding wire group comprises at least one arc-shaped bonding wire, wherein a vertex of an arc height of the arc-shaped bonding wire is away from the substrate body, wherein one end of each bonding wire unit of the second bonding wire group is electrically connected to the electrode of the first section and another end of each bonding wire unit of the second bonding wire group is electrically connected to the electrode of the second section, to perform, with the first bonding wire unit, the radio frequency signal transmission between the first section and the second section; and wherein arc heights of bonding wire units of the second bonding wire group located at sides of the second bonding wire group are higher than an arc height of a second bonding wire unit at another position in the second bonding wire group, and wherein an arc height of a fifth bonding wire unit in a central area of the second bonding wire group is lower than an arc height of a sixth bonding wire unit at another position in the second bonding wire group, so that currents passing through the bonding wire units of the second bonding wire group are the same.

9. The apparatus according to claim 8, wherein arc heights of bonding wire units located between the two sides and the central area of the second bonding wire group are gradually reduced in a direction from the two sides of the second bonding wire group to the central area, wherein the second bonding wire group comprises more than three bonding wire units.

10. The apparatus according to claim 8, wherein a distance between the first bonding wire group and the second bonding wire group is greater than a distance between adjacent bonding wire units of the first bonding wire group and greater than a distance between adjacent bonding wire units of the second bonding wire group.

11. The apparatus according to claim 8, wherein the central area of the second bonding wire group comprises one second bonding wire unit.

12. The apparatus according to claim 8, wherein the central area of the second bonding wire group comprises at least two second bonding wire units with a same arc height.

13. The apparatus according to claim 8, wherein distances between adjacent bonding wire units of the second bonding wire group are equal.

14. The apparatus according to claim 8, wherein the second bonding wire unit comprises multiple bonding wires, wherein arc heights of the multiple bonding wires are the same, and wherein a vertex of an arc height of the second bonding wire unit is a vertex of an arc height of any of the bonding wires of the second bonding wire unit.

15. The apparatus according to claim 8, wherein the second bonding wire group is of an axially symmetric structure that uses a middle position in the second bonding wire group as an axis of symmetry.

16. The apparatus according to claim 1, wherein the first section is an amplifier chip or a capacitor chip, and the second section is an amplifier chip or a capacitor chip.

17. A device, comprising:
an apparatus; and
an antenna;
wherein the apparatus is configured to process a radio frequency signal, and the antenna is configured to receive the radio frequency signal processed by the apparatus and transmit the radio frequency signal;
wherein the apparatus comprises a first section, a second section, and a first bonding wire group, wherein the first section and the second section are separately welded to a same side of a substrate body, and wherein the first bonding wire group comprises at least three first bonding wire units;
wherein there is a spacing between the bonding wire units of the first bonding wire group, wherein each of the first bonding wire units comprises at least one arc-shaped bonding wire, wherein a vertex of an arc height of the at least one arc-shaped bonding wire is away from the substrate body, wherein one end of each first bonding wire unit is electrically connected to an electrode of the first section, and wherein another end of each first bonding wire unit is electrically connected to an electrode of the second section, to perform radio frequency signal transmission between the first section and the second section; and wherein arc heights of bonding wire units located at two sides of the first bonding wire group are higher than an arc height of a first bonding wire unit at another position in the first bonding wire group, and wherein an arc height of a first bonding wire unit located in a central area of the first bonding wire group is lower than an arc height of a second bonding wire unit at another position in the first bonding wire group, so that currents passing through the at least three first bonding wire units are the same, or a phase difference between currents passing through any two bonding wire units of the first bonding wire group is less than a preset threshold.

18. An apparatus, comprising:
a first section;
a second section, wherein the first section and the second section are separately welded to a same side of a substrate body; and
a first bonding wire group;
wherein the first bonding wire group comprises at least three bonding wire units, and wherein there is a spacing between bonding wire units of the first bonding wire group;
wherein each bonding wire unit of the first bonding wire group comprises at least one arc-shaped bonding wire, wherein a vertex of an arc height of the at least one arc-shaped bonding wire is away from the substrate body, wherein one end of each bonding wire unit of the first bonding wire group is electrically connected to an electrode of the first section, and wherein another end of each bonding wire unit of the first bonding wire group is electrically connected to an electrode of the second section, to perform radio frequency signal transmission between the first section and the second section; and wherein arc heights of bonding wire units of the first bonding wire group located at two sides of the first bonding wire group are higher than an arc height of a first bonding wire unit at another position in the first bonding wire group, and wherein an arc height of a third bonding wire unit located in a central area of the first bonding wire group is lower than an arc height of a fourth bonding wire unit at another position in the first bonding wire group, so that a phase difference between currents passing through any two bonding wire units of the first bonding wire group is less than a preset threshold.

19. The apparatus according to claim 18, further comprising a second bonding wire group, wherein the second bonding wire group is located at one side of the first bonding wire group, and wherein the second bonding wire group comprises at least three bonding wire units, wherein there is a spacing between bonding wire units of the second bonding wire group;

wherein each bonding wire unit of the second bonding wire group comprises at least one arc-shaped bonding wire, wherein a vertex of an arc height of the arc-shaped bonding wire is away from the substrate body, wherein one end of each bonding wire unit of the second bonding wire group is electrically connected to the electrode of the first section and another end of each bonding wire unit of the second bonding wire group is electrically connected to the electrode of the second section, to perform, with the first bonding wire unit, the radio frequency signal transmission between the first section and the second section; and wherein arc heights of bonding wire units of the second bonding wire group located at sides of the second bonding wire group are higher than an arc height of a second bonding wire unit at another position in the second bonding wire group, and wherein an arc height of a fifth bonding wire unit in a central area of the second bonding wire group is lower than an arc height of a sixth bonding wire unit at another position in the second bonding wire group, so that a phase difference between currents passing through any two second bonding wire units is less than a preset threshold.

* * * * *